United States Patent
Huang et al.

(10) Patent No.: US 11,133,405 B2
(45) Date of Patent: *Sep. 28, 2021

(54) HIGH RUGGEDNESS HETEROJUNCTION BIPOLAR TRANSISTOR

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Min-Nan Tseng, Taoyuan (TW); Kai-Yu Chen, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,701

(22) Filed: Mar. 5, 2020

(65) Prior Publication Data

US 2020/0203510 A1    Jun. 25, 2020

Related U.S. Application Data

(63) Continuation-in-part of application No. 16/292,365, filed on Mar. 5, 2019.

(30) Foreign Application Priority Data

Nov. 20, 2018   (TW) .................................. 107141339

(51) Int. Cl.
*H01L 33/00* (2010.01)
*H01L 21/00* (2006.01)
(Continued)

(52) U.S. Cl.
CPC ...... *H01L 29/7373* (2013.01); *H01L 29/0804* (2013.01); *H01L 29/0817* (2013.01);
(Continued)

(58) Field of Classification Search
CPC ....... H01L 29/7371; H01L 2924/13051; H01L 29/0821; H01L 27/0823; H01L 29/732;
(Continued)

(56) References Cited

U.S. PATENT DOCUMENTS

| 5,468,658 A | * 11/1995 | Bayraktaroglu | .... H01L 29/1004 438/312 |
| 5,719,415 A | * 2/1998 | Yagura | .............. H01L 29/42304 257/191 |

(Continued)

FOREIGN PATENT DOCUMENTS

JP     2007-335586     12/2007

OTHER PUBLICATIONS

Non-Final Office Action for U.S. Appl. No. 16/292,365 dated Jul. 6, 2020.
Taiwanese Office Action for Taiwanese Patent Application No. 109100043 dated Sep. 9, 2020.

*Primary Examiner* — Alonzo Chambliss
(74) *Attorney, Agent, or Firm* — Amin, Turocy & Watson, LLP

(57) ABSTRACT

Provided is a high ruggedness HBT, including a first emitter cap layer and a second emitter cap layer formed between an emitter layer and an ohmic contact layer, or only an emitter cap layer is formed between them. When the first and second emitter cap layers are provided, bandgaps of the first or second emitter cap layer are changed, and the ruggedness of the HBT is improved. When an emitter cap layer is provided, an electron affinity of at least a portion of the emitter cap layer is less than or approximately equal to an electron affinity of the emitter layer, and the ruggedness of the HBT is improved.

20 Claims, 12 Drawing Sheets

(51) Int. Cl.
*H01L 29/737* (2006.01)
*H01L 29/205* (2006.01)
*H01L 29/08* (2006.01)
*H01L 29/10* (2006.01)

(52) U.S. Cl.
CPC ...... *H01L 29/0821* (2013.01); *H01L 29/0826* (2013.01); *H01L 29/1004* (2013.01); *H01L 29/205* (2013.01); *H01L 29/7375* (2013.01); *H01L 33/0025* (2013.01)

(58) Field of Classification Search
CPC ............. H01L 29/0804; H01L 33/0025; H01L 29/0817; H01L 29/205; H01L 29/7785; H01L 29/7375
See application file for complete search history.

(56) References Cited

U.S. PATENT DOCUMENTS

| | | |
|---|---|---|
| 6,611,008 B2 | 8/2003 | Twynam et al. |
| 7,812,249 B2 | 10/2010 | King et al. |
| 8,120,147 B1 | 2/2012 | Sugg |
| 9,905,678 B2 | 2/2018 | Zampardi et al. |
| 10,418,468 B2 | 9/2019 | Zampardi et al. |
| 10,629,711 B2 | 4/2020 | Zampardi et al. |
| 10,651,298 B2 * | 5/2020 | Chin .................. H01L 29/0821 |
| 2004/0195588 A1 | 10/2004 | Hase |
| 2007/0023783 A1 | 2/2007 | Hase et al. |
| 2017/0236925 A1 | 8/2017 | Zampardi et al. |
| 2018/0190801 A1 | 7/2018 | Zampardi et al. |
| 2019/0341477 A1 | 11/2019 | Zampardi et al. |

* cited by examiner

HIGH RUGGEDNESS HETEROJUNCTION BIPOLAR TRANSISTOR

CROSS-REFERENCE TO RELATED APPLICATION

This application is a continuation-in-part application of and claims the priority benefit of a prior application Ser. No. 16/292,365, filed on Mar. 5, 2019. The entirety of each of the above-mentioned patent applications is hereby incorporated by reference herein.

TECHNICAL FIELD

The technical field relates to a transistor, especially a heterojunction bipolar transistor.

BACKGROUND

The heterojunction bipolar transistors (HBTs) use different semiconductor materials to form the emitter and the base layers, and form a heterojunction at the junction of the emitter and the base. The advantage is that the emitter injection efficiency increases because the hole flowing from the base to the emitter is more difficult to cross the valence band offset ($\Delta Ev$) between the base and the emitter, especially when the emitter is made of InGaP, InGaAsP or InAlGaP, and the valence band hole barrier of the emitter and the base is particularly large. As a result, the HBT can maintain high current gain and improve high frequency response with high base doping concentration. When the HBT is used as a power amplifier (PA) for a handheld device, the power added efficiency (PAE) is particularly important. On the HBT device, in addition to improving the PAE by adjusting the HBT epitaxial layer structure, the operating voltage or current modification of the PA by circuit design can also effectively improve the PAE. However, when the HBT operates at a high voltage or a high current, the HBT is prone to damage due to excessive power. For example, the excessive power rebounded back when the PA is not in the impedance match condition and causes the ruggedness issue of the HBT. Therefore, how to effectively improve the ruggedness of an HBT under high voltage or high current (i.e., high power density) operation is an important topic.

FIG. 1 is a schematic view of an HBT structure in a prior art, which shows that a sub-collector layer 20, a collector layer 30, a base layer 40, an emitter layer 50, an emitter cap layer 60 and an ohmic contact layer 70 are sequentially stacked on a substrate 10 from bottom to top in the HBT 1. In general, the emitter layer 50 is formed of InGaP and the emitter cap layer 60 is formed of GaAs, and there is a type I band alignment and a large conduction band offset ($\Delta Ec$) at the junction of the two layers, thereby a large electron potential barrier is formed. Then, as shown in FIG. 2, when electrons flow from the emitter cap layer 60 to the emitter layer 50, the potential barrier of the conduction band blocks the electrons flow, thereby causing a large emitter resistance (Re). To reduce the emitter resistance, a highly doped N-type GaAs is generally used in the emitter cap layer 60. However, when a highly doped or lower bandgap emitter cap layer 60 is used, the breakdown voltage (BVebo) of the emitter-base junction is lowered or the emitter-base junction capacitance (Cbe) is increased, thereby having negative impacts on the HBT ruggedness or performance. In this regard, to increase the breakdown voltage of the emitter-base junction and reduce the emitter-base junction capacitance, usually increasing the emitter layer 50 thickness is the most effective way. However, this way causes not only the difficulty of the HBT device process, but also the higher emitter resistance, thereby affecting the RF characteristics of the HBT.

SUMMARY

The present disclosure provides a high ruggedness heterojunction bipolar transistor. In addition to effectively increasing the breakdown voltage of the emitter-base junction and reducing the emitter-base junction capacitance without increasing or with slightly increasing the emitter resistance, the HBTs can also use the aluminum-containing (Al) semiconductor material such as AlGaAs, which has a higher bandgap and the resistivity rises rapidly with temperature, e.g., at a high temperature, to improve the ruggedness of the PA under very high power density operation. In general, there is a trade-off between PA ruggedness and RF characteristics (PAE, linearity, etc.). The efficiency and linearity of the PA can be enhanced by sacrificing PA ruggedness in the present disclosure through changing the HBT design. Therefore, the present disclosure can improve efficiency, linearity or overall performance of the PA and have more design flexibility.

The present disclosure provides a high ruggedness heterojunction bipolar transistor, comprising: a substrate; a sub-collector layer being on the substrate and comprising an N-type III-V semiconductor material; a collector layer being on the sub-collector layer and comprising a III-V semiconductor material; a base layer being on the collector layer and comprising a P-type III-V semiconductor material; an emitter layer being on the base layer and comprising an N-type semiconductor material selected from the group consisting of InGaP, InGaAsP and InAlGaP; a first emitter cap layer being on the emitter layer and comprising a III-V semiconductor material; a second emitter cap layer being on the first emitter cap layer and comprising a III-V semiconductor material; and an ohmic contact layer being on the second emitter cap layer and comprising an N-type III-V semiconductor material, wherein in a direction of the second emitter cap layer towards the emitter layer, a bandgap of the first emitter cap layer or the second emitter cap layer includes at least one of a gradually-increasing bandgap and a constant bandgap.

In an embodiment of the present disclosure, the first emitter cap layer comprises at least a semiconductor material selected from the group consisting of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, $Al_xGa_{1-x}As_{1-n}Bi_n$, $In_rAl_xGa_{1-x-r}As$ and $In_rAl_xGa_{1-x-r}P$, where $0<x<1$, wherein a maximum value of x may be $0.03 \leq x \leq 0.8$ or a maximum value of x may be $0.05 \leq x \leq 0.4$, and y, z, r, w, n$\leq$0.1.

In an embodiment of the present disclosure, the first emitter cap layer or the second emitter cap layer comprises at least a uniform layer.

In an embodiment of the present disclosure, the first emitter cap layer or the second emitter cap layer comprises at least a graded layer, and in the direction of the second emitter cap layer towards the emitter layer, a bandgap of the graded layer includes at least a gradually increasing bandgap.

In an embodiment of the present disclosure, the first emitter cap layer comprises at least a combination of a uniform layer and a graded layer, and in the direction of the second emitter cap layer towards the emitter layer, a bandgap of the graded layer comprises a gradually increasing bandgap.

In an embodiment of the present disclosure, the first emitter cap layer or the second emitter cap layer has a thickness of 1 nm to 500 nm, and an N-type doping concentration of the first emitter cap layer or the second emitter cap layer is between $1\times10^{15}/cm^3$ and $5\times10^{18}/cm^3$.

In an embodiment of the present disclosure, by photoluminescence (PL) spectroscopy, in the N-type semiconductor material of the emitter layer, the photoluminescence peak wavelength of InGaP is 694 nm or less, the photoluminescence peak wavelength of InGaAsP is 710 nm or less, and the photoluminescence peak wavelength of InAlGaP is 685 nm or less.

In an embodiment of the present disclosure, by photoluminescence (PL) spectroscopy, in the N-type semiconductor material of the emitter layer, the photoluminescence peak wavelength of InGaP is 685 nm or less, the photoluminescence peak wavelength of InGaAsP is 695 nm or less, and the photoluminescence peak wavelength of InAlGaP is 675 nm or less.

In an embodiment of the present disclosure, by photoluminescence (PL) spectroscopy, in the N-type semiconductor material of the emitter layer, the photoluminescence peak wavelength of InGaP is 675 nm or less, the photoluminescence peak wavelength of InGaAsP is 685 nm or less, and the photoluminescence peak wavelength of InAlGaP is 665 nm or less. For example, the photoluminescence peak wavelength of InGaP is between 650 nm and 670 nm, or the photoluminescence peak wavelength of InGaP is 655 nm, 660 nm or 665 nm.

In an embodiment of the present disclosure, the present disclosure further comprises an intermediate composite layer being between the substrate and the sub-collector layer.

In an embodiment of the present disclosure, the intermediate composite layer comprises at least a buffer layer, and the buffer layer comprises a III-V semiconductor material.

In an embodiment of the present disclosure, the intermediate composite layer comprises a field effect transistor.

In an embodiment of the present disclosure, the intermediate composite layer comprises a pseudomorphic high electron mobility transistor which is sequentially stacked on the substrate, comprising: at least a buffer layer, a first donor layer, a first spacer layer, a channel layer, a second spacer layer, a second donor layer, a Schottky layer, an etch stop layer, and a cap layer for ohmic contact, wherein the buffer layer comprises a III-V semiconductor material; the first donor layer or the second donor layer comprises an N-type semiconductor material selected from the group consisting of GaAs, AlGaAs, InAlGaP, InGaP, and InGaAsP; the first spacer layer or the second spacer layer comprises at least a semiconductor material selected from the group consisting of GaAs, AlGaAs, InAlGaP, InGaP, and InGaAsP; the channel layer comprises at least a semiconductor material selected from the group consisting of GaAs, InGaAs, AlGaAs, InAlGaP, InGaP, and InGaAsP; the Schottky layer comprises at least a semiconductor material selected from the group consisting of GaAs, AlGaAs, InAlGaP, InGaP, and InGaAsP; the etch stop layer comprises at least a semiconductor material selected from the group consisting of GaAs, AlGaAs, InAlGaP, InGaAsP, InGaP, and AlAs; and the cap layer comprises an N-type III-V semiconductor material.

In an embodiment of the present disclosure, the present disclosure further comprises a spacer layer between the first emitter cap layer and the emitter layer or between the first emitter cap layer and the second emitter cap layer, and the spacer layer comprises an N-type or undoped III-V semiconductor material.

In an embodiment of the present disclosure, the spacer layer has a thickness of 0.2 nm to 200 nm, and an N-type doping concentration of the spacer layer is between $1\times10^{15}/cm^3$ and $5\times10^{18}/cm^3$.

In an embodiment of the present disclosure, the spacer layer comprises at least a material selected from the group consisting of AlGaAs, AlGaAsN, AlGaAsP, AlGaAsSb, AlGaAsBi, InAlGaAs, InGaP, InGaAsP, InGaAs, GaAsSb, InAlGaP, and GaAs.

In an embodiment of the present disclosure, the spacer layer comprises a bandgap selected from the group consisting of a gradually-increasing bandgap, a constant bandgap and a gradually-decreasing bandgap.

Provided is a high ruggedness heterojunction bipolar transistor, comprising: a substrate; a sub-collector layer being on the substrate and comprising an N-type III-V semiconductor material; a collector layer being on the sub-collector layer and comprising a III-V semiconductor material; a base layer being on the collector layer and comprising a P-type III-V semiconductor material; an emitter layer being on the base layer and comprising an N-type III-V semiconductor material; an emitter cap layer being on the emitter layer and comprising a III-V semiconductor material; and an ohmic contact layer being on the emitter cap layer and comprising an N-type III-V semiconductor material, wherein at least a portion of the emitter cap layer is a current clamping layer, and an electron affinity of the current clamping layer is less than or approximately equal to the electron affinity of the emitter layer.

In an embodiment of the present disclosure, the emitter layer comprises at least an N-type semiconductor material selected from the group consisting of InGaP, InGaAsP, AlGaAs, and InAlGaP, and the current clamping layer comprises at least a material selected from the group consisting of AlGaAs, AlGaAsN, AlGaAsP, AlGaAsSb, AlGaAsBi, InAlGaAs, InGaP, InGaAsP, GaAsSb, InAlGaP, InGaAs and GaAs.

In an embodiment of the present disclosure, the emitter cap layer comprises at least a uniform layer.

In an embodiment of the present disclosure, the emitter cap layer comprises a graded layer, and in the direction of the ohmic contact layer towards the emitter layer, a bandgap of the graded layer includes at least a gradually-increasing bandgap.

In an embodiment of the present disclosure, the emitter cap layer comprises at least a combination of the uniform layer and the graded layer, and in the direction of the ohmic contact layer towards the emitter layer, a bandgap of the graded layer includes at least a gradually-increasing bandgap.

In an embodiment of the present disclosure, the emitter cap layer has a thickness of 1 nm to 500 nm, and an N-type doping concentration of the emitter cap layer is between $1\times10^{15}/cm^3$ and $5\times10^{18}/cm^3$.

In an embodiment of the present disclosure, by photoluminescence spectroscopy, in the N-type semiconductor material of the emitter layer, the photoluminescence peak wavelength of InGaP is 694 nm or less, the photoluminescence peak wavelength of InGaAsP is 710 nm or less, and the photoluminescence peak wavelength of InAlGaP is 685 nm or less.

In an embodiment of the present disclosure, by photoluminescence spectroscopy, in the N-type semiconductor material of the emitter layer, the photoluminescence peak wavelength of InGaP is 685 nm or less, the photoluminescence peak wavelength of InGaAsP is 695 nm or less, and the photoluminescence peak wavelength of InAlGaP is 675 nm or less.

In an embodiment of the present disclosure, by photoluminescence spectroscopy, in the N-type semiconductor material of the emitter layer, the photoluminescence peak wavelength of InGaP is 675 nm or less, the photoluminescence peak wavelength of InGaAsP is 685 nm or less, and the photoluminescence peak wavelength of InAlGaP is 665 nm or less. For example, the photoluminescence peak wavelength of InGaP is between 650 nm and 670 nm, or the photoluminescence peak wavelength of InGaP is 655 nm, 660 nm or 665 nm.

In an embodiment of the present disclosure, the present disclosure further comprises an intermediate composite layer between the substrate and the sub-collector layer.

In an embodiment of the present disclosure, the intermediate composite layer comprises at least a buffer layer, wherein the buffer layer comprises a III-V semiconductor material.

In an embodiment of the present disclosure, the intermediate composite layer comprises a field effect transistor.

In an embodiment of the present disclosure, the intermediate composite layer comprises a pseudomorphic high electron mobility transistor which is sequentially stacked on the substrate and comprises: at least a buffer layer, a first donor layer, a first spacer layer, a channel layer, a second spacer layer, a second donor layer, a Schottky layer, an etch stop layer, and a cap layer for ohmic contact, wherein the buffer layer comprises a III-V semiconductor material; the first donor layer or the second donor layer comprises at least an N-type semiconductor material selected from the group consisting of GaAs, AlGaAs, InAlGaP, InGaP, and InGaAsP; the first spacer layer or the second spacer layer comprises at least a semiconductor material selected from the group consisting of GaAs, AlGaAs, InAlGaP, InGaP, and InGaAsP; the channel layer comprises a semiconductor material selected from the group consisting of GaAs, InGaAs, AlGaAs, InAlGaP, InGaP, and InGaAsP; the Schottky layer comprises at least a semiconductor material selected from the group consisting of GaAs, AlGaAs, InAlGaP, InGaP, and InGaAsP; the etch stop layer comprises at least a semiconductor material selected from the group consisting of GaAs, AlGaAs, InAlGaP, InGaAsP, InGaP, and AlAs; and the cap layer comprises an N-type III-V semiconductor material.

In an embodiment of the present disclosure, the present disclosure further comprises a spacer layer between the emitter cap layer and the emitter layer or between the emitter cap layer and the ohmic contact layer, and the spacer layer comprises an N-type or undoped III-V semiconductor material.

In an embodiment of the present disclosure, the spacer layer has a thickness of 0.2 nm to 200 nm, and an N-type doping concentration of the spacer layer is between $1 \times 10^{15}/cm^3$ and $5 \times 10^{18}/cm^3$.

In an embodiment of the present disclosure, the spacer layer comprises at least a material selected from the group consisting of AlGaAs, AlGaAsN, AlGaAsP, AlGaAsSb, AlGaAsBi, InAlGaAs, InGaP, InGaAsP, InAlGaP, InGaAs, GaAsSb and GaAs.

In an embodiment of the present disclosure, the spacer layer comprises a bandgap selected from the group consisting of a gradually-increasing bandgap, a constant bandgap and a gradually-decreasing bandgap.

DESCRIPTION OF THE EMBODIMENTS

Figure 1:
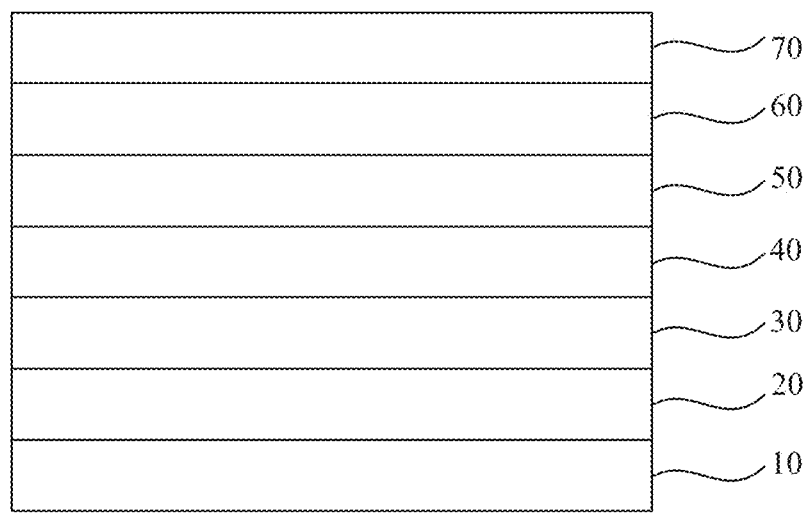
FIG. 1 shows a schematic view of a HBT structure in the prior art.
Figure 2:
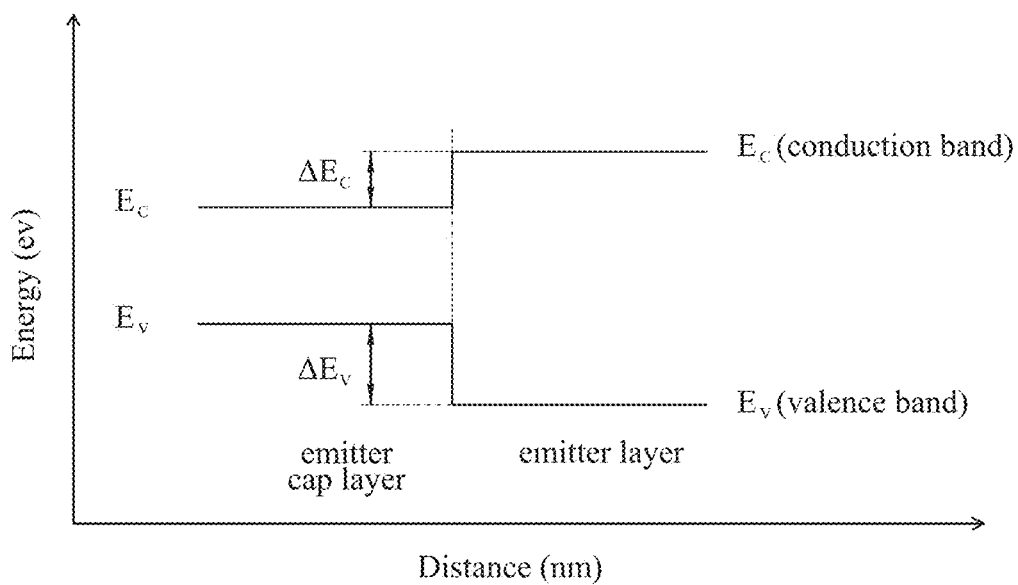
FIG. 2 shows a schematic view of the energy band diagram between an emitter cap layer and an emitter layer in a HBT of the prior art.

The embodiment of the present disclosure is described in detail below with reference to the drawings and element symbols, such that persons skilled in the art is able to implement the present application after understanding the specification of the present disclosure.

Specific examples of components and arrangements are described below to simplify the present disclosure. These are, of course, merely examples and they are not intended to limit the scope of the present disclosure. In the present disclosure, for example, when a first epitaxial layer formed above or on a second epitaxial layer, it may include an exemplary embodiment in which the first epitaxial layer is in direct contact with the second epitaxial layer, or it may include an exemplary embodiment in which other elements or epitaxial layers are formed between thereof, such that the first epitaxial layer is not in direct contact with the second epitaxial layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one element or feature's relationship to another element(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

Figure 3:
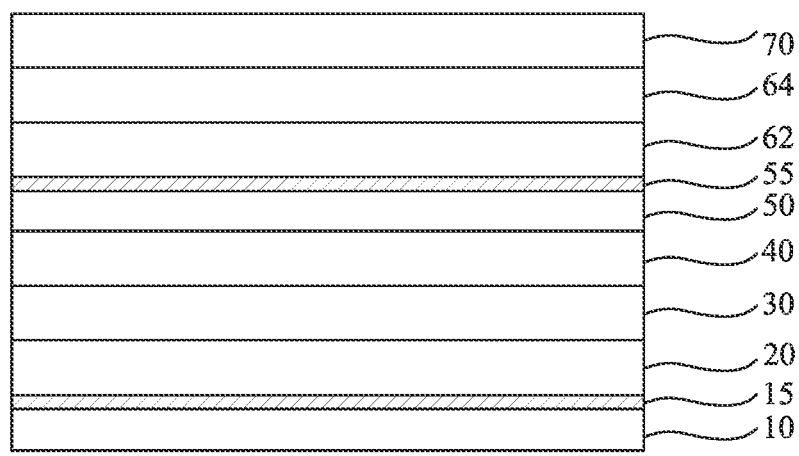
FIG. 3 shows a schematic view of a high ruggedness HBT structure in accordance with a first embodiment of the present disclosure, wherein the HBT structure includes a first emitter cap layer and a second emitter cap layer.

FIG. 3 shows a schematic view of a high ruggedness heterojunction bipolar transistor (HBT) structure in accordance with an exemplary embodiment of the present disclosure. As shown in FIG. 3, the HBT structure 2 includes: a substrate 10, a sub-collector layer 20, a collector layer 30, a base layer 40, an emitter layer 50, a first emitter cap layer 62, a second emitter cap layer 64 and an ohmic contact layer 70.

In the HBT structure 2, the sub-collector layer 20 is on the substrate 10 and includes an N-type III-V semiconductor material; the collector layer 30 is on the sub-collector layer 20 and includes a III-V semiconductor material; the base layer 40 is on the collector layer 30 and includes a P-type III-V semiconductor material; the emitter layer 50 is on the base layer 40 and includes an N-type semiconductor material selected from the group consisting of InGaP, InGaAsP and InAlGaP; the first emitter cap layer 62 is on the emitter layer 50 and includes a III-V semiconductor material; the second emitter cap layer 64 is on the first emitter cap layer 62 and includes a III-V semiconductor material; and the ohmic contact layer 70 is on the second emitter cap layer 64 and includes an N-type III-V semiconductor material.

The first emitter cap layer includes at least an undoped or N-type semiconductor material selected from the group consisting of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, $Al_xGa_{1-x}As_{1-n}Bi_n$, $In_rAl_xGa_{1-x-r}As$ and $In_rAl_xGa_{1-x-r}P$, wherein $0<x<1$. In some embodiments, a largest (maximum) value of x is $0.03 \leq x \leq 0.8$; In some embodiments, a largest (maximum) value of x is: $0.05 \leq x \leq 0.4$, and y, z, r, w, $n \leq 0.1$.

In addition, the materials of the sub-collector layer 20, the collector layer 30, the base layer 40, the second emitter cap layer 64, and the ohmic contact layer 70 are not limited as long as they are semiconductor materials capable of functioning the HBT. Accordingly, the appropriate materials may be selected based on needs. The sub-collector layer 20 may include an N-type semiconductor material selected from the group consisting of GaAs, AlGaAs, InGaP, and InGaAsP. The collector layer 30 may include a semiconductor material selected from the group consisting of GaAs, AlGaAs, InGaP, and InGaAsP. These semiconductor material of the collector layer 30 may be P-type, N-type or undoped; for example, at least a portion of the collector layer 30 is N-type; the base layer 40 may include a P-type semiconductor material selected from the group consisting of GaAs, GaAsSb, InGaAs, and InGaAsN. The second emitter cap layer 64 may include an N-type semiconductor material selected from the group consisting of GaAs, AlGaAs, InGaP, InGaAsP, AlGaAsN, AlGaAsP, AlGaAsSb, AlGaAsBi, InAlGaAs, InAlGaP, InGaAs and GaAsSb. The ohmic contact layer 70 may include an N-type semiconductor material selected from the group consisting of GaAs and InGaAs.

Moreover, the bandgap of the first emitter cap layer 62 or the second emitter cap layer 64 can be changed by the composition change. The bandgap of first emitter cap layer 62 or the second emitter cap layer 64 includes a gradually-increasing bandgap or a constant bandgap in the direction from the second emitter cap layer 64 to the emitter layer 50. The bandgap of the bandgap graded of the first emitter cap layer 62 may start from the bandgap of the second emitter cap layer 64, but is not limited thereto; or the bandgap of the bandgap graded of the second emitter cap layer 64 may start from the bandgap of the ohmic contact layer, but is not limited thereto. Thus, conduction band offset between the second emitter layer 64 and emitter layer 50 can be reduced or eliminated. When the emitter-base junction of the HBT is under forward bias, electron barrier between the second emitter cap layer 64 and the emitter layer 50 can also be reduced or eliminated. Therefore, the HBT RF characteristics and ruggedness can be improved.

A bandgap of the first emitter cap layer 62 or the second emitter cap layer 64 includes a uniform layer, a graded layer or a combination of the uniform layer and a graded layer.

In an embodiment of the present disclosure, the first emitter cap layer 62 includes at least a graded layer. The graded layer may be an undoped or N-type semiconductor material selected from the group consisting of AlGaAs, AlGaAsN, AlGaAsP, AlGaAsSb, AlGaAsBi, InAlGaP and InAlGaAs, in which Al composition is graded, and the Al composition gradually increases along a direction from the second emitter cap layer 64 towards the emitter layer 50. When the amount of the Al composition is higher, the bandgap of the first emitter cap layer 62 is larger, so that the bandgap of the first emitter cap layer 62 gradually increases along the direction from the second emitter cap layer 64 towards the emitter layer 50. Then, when the first emitter cap layer 62 includes a bandgap with linear grade, as shown in FIG. 4a, the bandgap of the first emitter cap layer 62 shows a linear change between the second emitter cap layer 64 and the emitter layer 50, so when electrons flow from the second emitter cap layer 64 to the emitter layer 50 as the emitter-base junction is forwardly biased, the conduction band barrier is reduced, thus effectively reducing the emitter resistance.

Figure 4A:
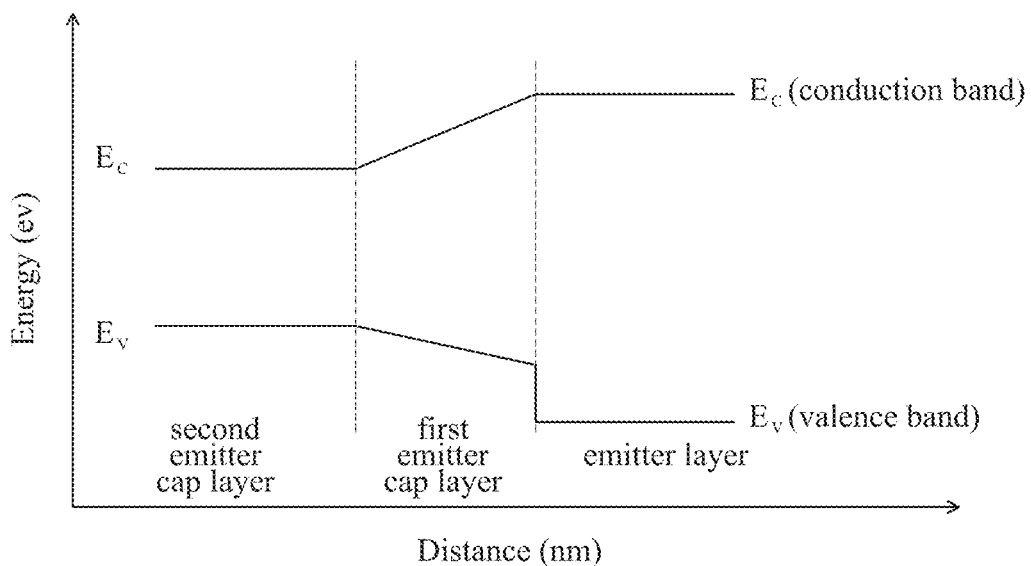
FIGS. 4a-4c show schematic views of the energy band diagram between the emitter cap layer and the emitter layer in accordance with the HBT of the present disclosure.

Although FIG. 4a shows an embodiment wherein the bandgap of the first emitter cap layer is linearly graded, the bandgap of the graded layer can also be a non-linear grade by composition change, so as to effectively reduce the emitter resistance. The result is shown in FIG. 4b.

Alternatively, the first emitter cap layer 62 may be a graded layer of two or more layers. FIG. 4c shows an embodiment that the first emitter cap layer 62 includes a bandgap with linear and non-linear graded layers, but not limited to the above embodiment. Other embodiments may include a plurality of layers with linear or non-linear bandgap grade layers, or a combination a plurality of linear and non-linear bandgap grade layers.

Figure 4B:
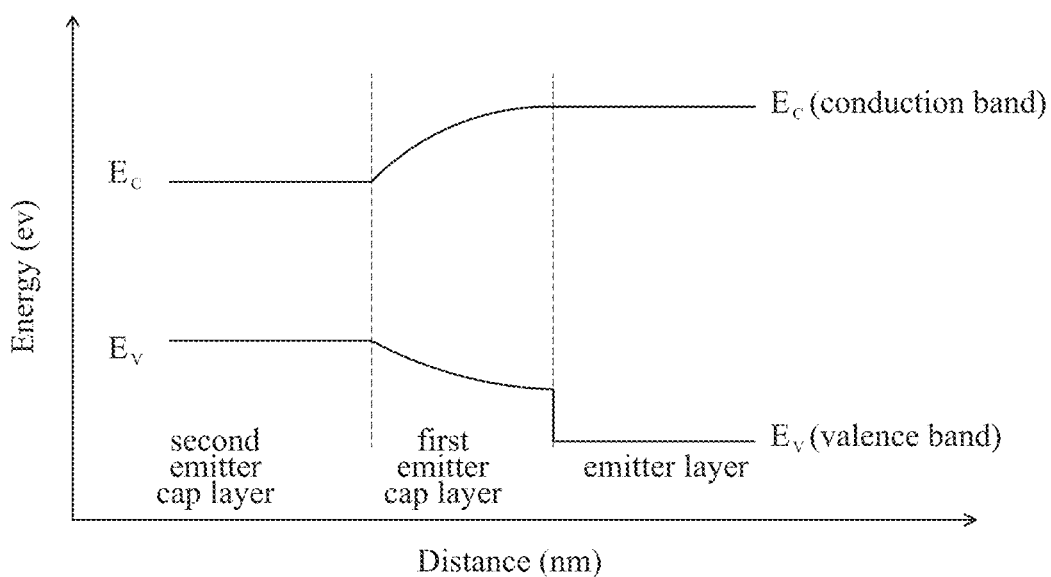
Figure 4C:
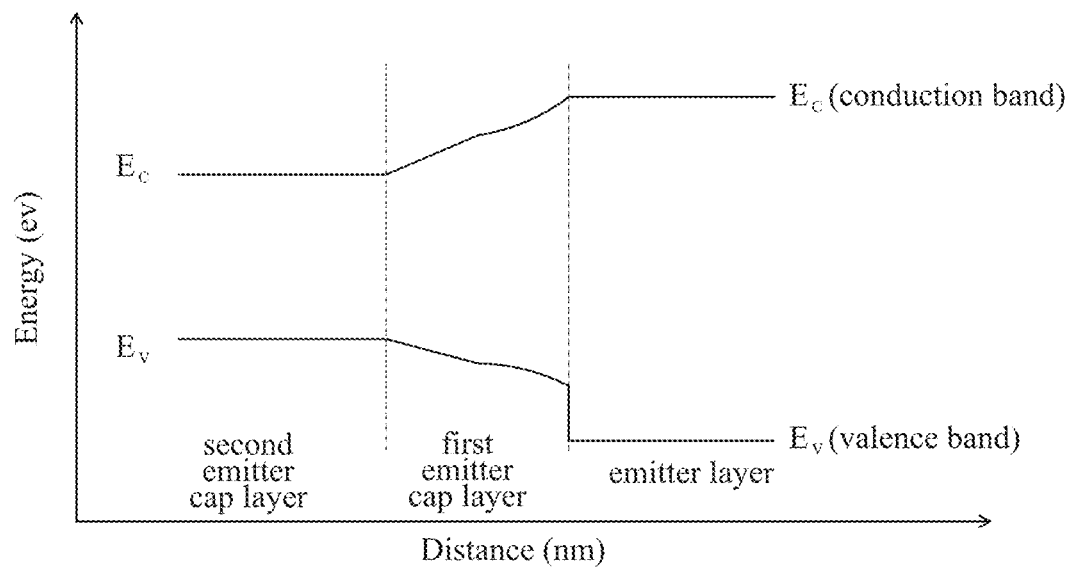

In addition, although FIGS. 4a-4c show only the embodiment wherein there is no conduction band offset between the first emitter cap layer 62 and the emitter layer 50, the conduction band alignment between the first emitter cap 62 and emitter 50 can be Type I or Type II by adjusting composition of the first emitter cap layer, where the Type I band alignment indicates the energy level of conduction band of the first emitter cap 62 is lower than that of emitter layer 5 and the Type II band alignment indicates the energy level of conduction band of the first emitter cap 62 is higher than that of emitter layer 50.

Further, the material composition in a semiconductor layer is described. Taking $Al_{0.03}Ga_{0.97}As_{0.9}P_{0.1}$ as an example ($Al_xGa_{1-x}As_{1-z}P_z$, x=0.03 and z=0.1), it indicates that the total number of moles of group III (Al and Ga) is equal to total number of moles of group V (As and P), the mole fraction between the elements is Al:Ga:As:P=0.03:0.97:0.9:0.1. Regarding the Al composition of the first emitter cap layer 62, "a largest value of x is between 0.03 and 0.8 ($0.03 \leq x \leq 0.8$)" means that the Al composition of the first emitter cap layer 62 can be varied from a certain value to its largest value or from its largest value to a certain value. The Al composition can even be varied from zero or to zero. However, as long as the Al composition therein is the highest, the largest value of x should be between 0.03 and 0.8 ($0.03 \leq x \leq 0.8$). When the largest Al composition x in the first emitter cap layer 62 is $\geq 0.03$, the electron potential barrier between the first emitter cap layer 62 and the emitter layer 50 can be reduced or eliminated as compared with the conventional GaAs emitter cap layer or even form the Type II band alignment to eliminate the potential barrier with the emitter layer 50. When the highest Al composition is at $x \leq 0.8$, the risk of HBT reliability issue caused by the excess of the Al may be avoided or reduced.

Figure 5A:
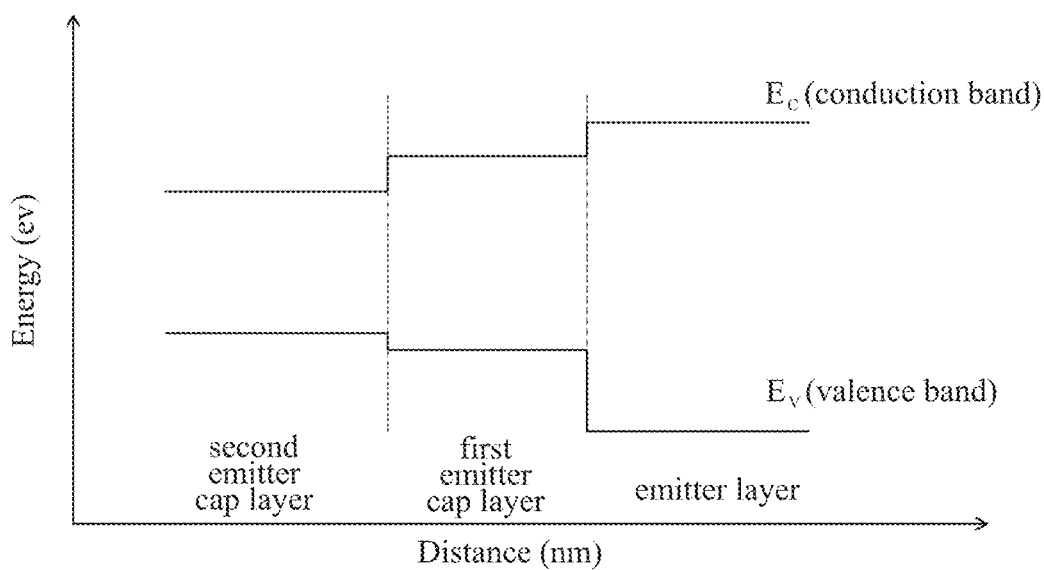
FIGS. 5a-5b show schematic views of the energy band diagram between the emitter cap layer and the emitter layer in accordance with the HBT of the present disclosure.

In an embodiment of the present disclosure, the first emitter cap layer 62 include a uniform layer of substantially uniform material, and mainly includes an undoped or N-type semiconductor material selected from the group consisting of AlGaAs, AlGaAsN, AlGaAsP, AlGaAsSb, AlGaAsBi, InAlGaP and InAlGaAs. When the first emitter cap layer 62 is a uniform layer with constant bandgap, shown in FIG. 5a, since the bandgap of the first emitter cap layer 62 is constant, and its energy level of the conduction band is between the conduction band of the second emitter cap layer 64 and the conduction band of the emitter layer 50. FIG. 5a also shows that the conduction band between the second emitter cap layer 64 and the emitter layer 50 changes stepwise through the first emitter cap layer 62. Therefore, when the electrons pass through, the conduction band barrier to be overcome each time is relatively small, and the emitter resistance between the second emitter cap layer 64 and the emitter layer 50 can be reduced.

Figure 5B:
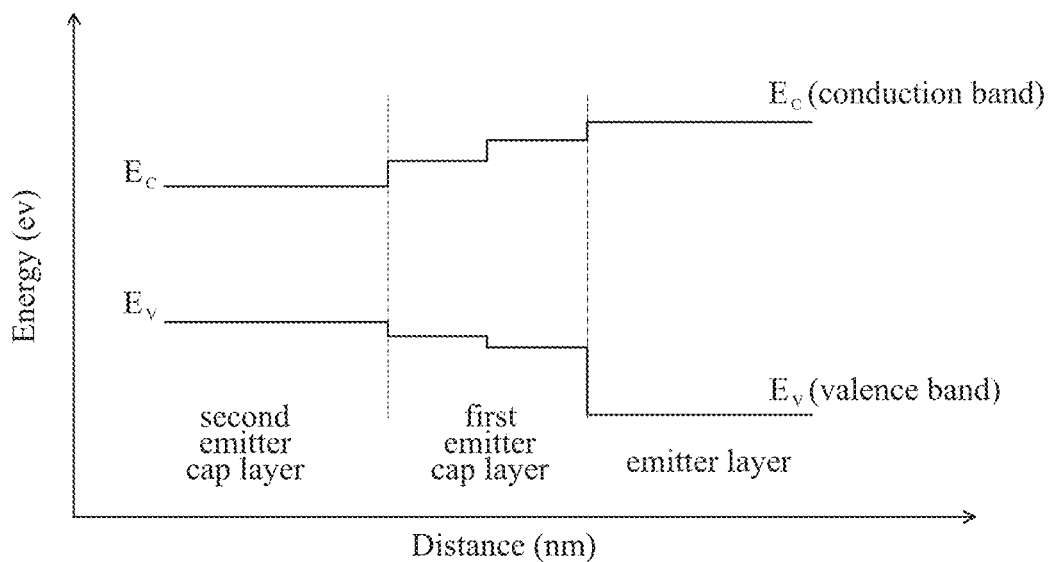

In addition, the first emitter cap layer 62 may be two or more uniform layers, and FIG. 5b shows an embodiment wherein the first emitter cap layer 62 includes two uniform layers. By changing the composition (for example, by increasing Al content), the energy level of the conduction band of the uniform layer is increased layer by layer, so that each of the conduction band barriers between the second emitter cap layer 64 and the emitter layer 50 is relatively smaller, and thus the emitter resistance between the second emitter cap layer 64 and the emitter layer 50 can be reduced.

In addition, although FIG. 5a and FIG. 5b only show an embodiment wherein the conduction band of the first emitter cap layer 62 is lower than the conduction band of the emitter layer 50, it is also possible to adjust the Al or other compositions to make the conduction band of the first emitter cap layer 62 is of the same height as the conduction band of the emitter layer 50, or the conduction band of the first emitter cap layer 62 is higher than the conduction band of the emitter layer 50.

Figure 6A:
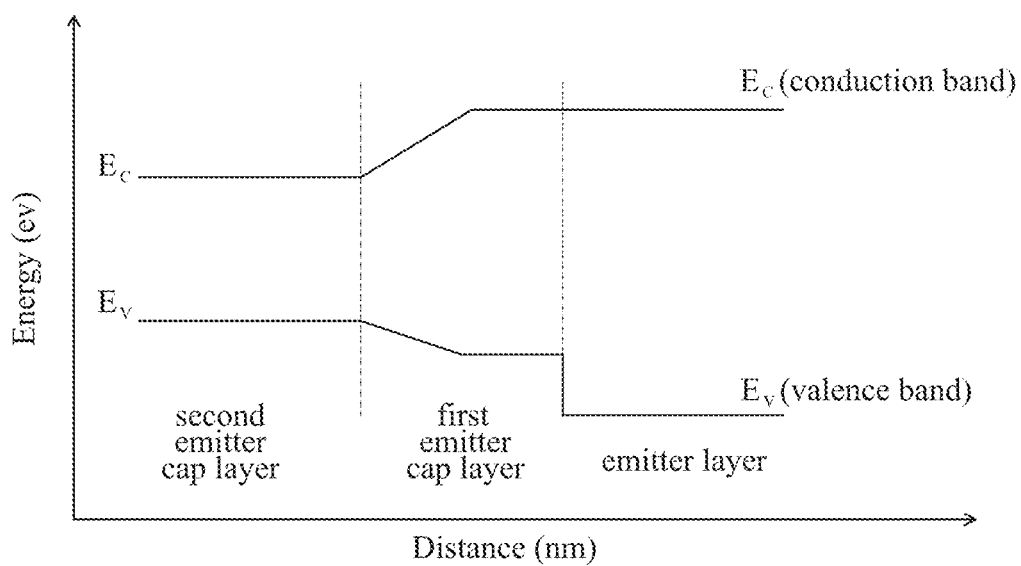
FIGS. 6a-6c show schematic views of the energy band diagram between the emitter cap layer and the emitter layer in accordance with the HBT of the present disclosure.
Figure 6B:
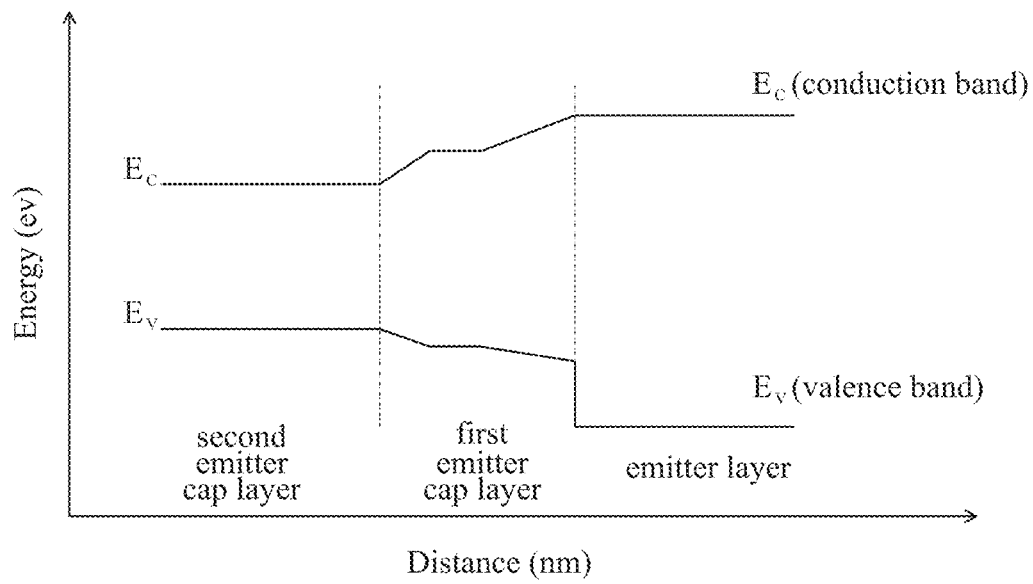
Figure 6C:
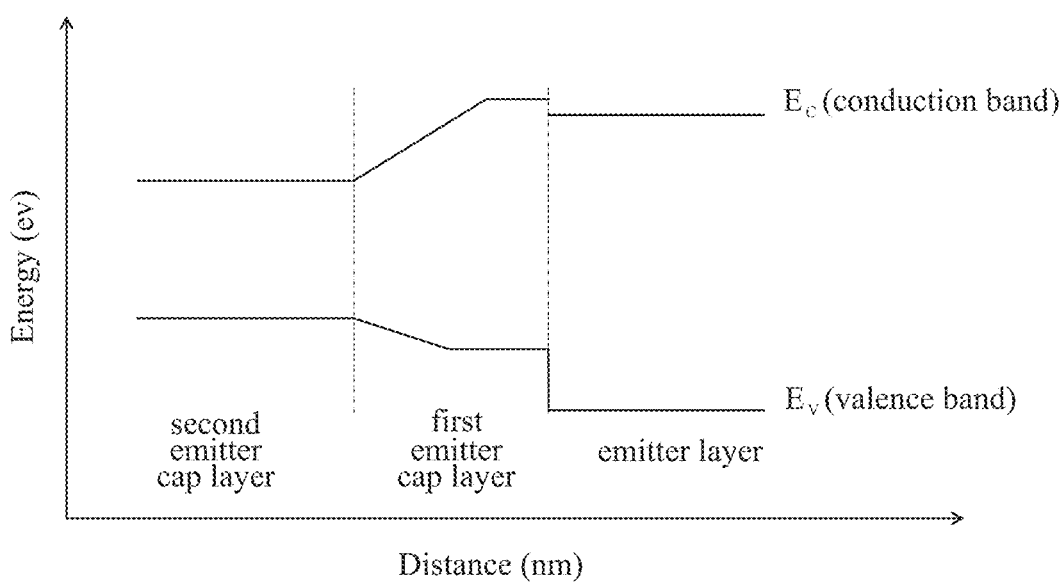

In an embodiment of the present disclosure, the first emitter cap layer 62 may include a combination of at least a uniform layer and at least a graded layer, wherein the uniform layer includes an undoped or an N-type semiconductor material selected from the group consisting of AlGaAs, AlGaAsN, AlGaAsP, AlGaAsSb, AlGaAsBi, InAlGaP and InAlGaAs; The graded layer includes an undoped or an N-type semiconductor material selected from the group consisting of AlGaAs, AlGaAsN, AlGaAsP, AlGaAsSb, AlGaAsBi, InAlGaP and InAlGaAs. Also, in the direction from the second emitter cap layer 64 to the emitter layer 50, the bandgap of the graded layer gradually increases. As shown in FIG. 6a, in the direction from the second emitter cap layer 64 to the emitter layer 50, when the first emitter cap layer 62 sequentially includes a graded layer with linear bandgap grade and a uniform layer, the energy level of the conduction band between the second emitter cap layer 64 and the emitter layer 50 is first linearly increased and then keeps constant. Moreover, as shown in FIG. 6b, when the first emitter cap layer 62 sequentially includes a graded layer with linear bandgap grade, a uniform layer, and a graded layer with linear bandgap grade, the energy level of the conduction band between the second emitter cap layer 64 and the emitter layer 50 is first linearly increased, then keeps constant, and then finally increases linearly, wherein the slopes of the linear grade of the two graded layers may be the same or different. In addition, the combination of at least a uniform layer and at least a graded layer is not limited thereto, and may be alternately stacked by a plurality of uniform layers and a plurality of graded layers to form an embodiment having a plurality of constant bandgaps and graded bandgaps. Further, as shown in FIG. 6c, the first emitter cap layer 62 sequentially includes a graded layer having a linear graded bandgap layer and a uniform layer. The conduction band energy level of the uniform layer of the first emitter cap layer 62 is higher than the conduction band energy level of the emitter layer. The first emitter cap layer of the HBT in FIG. 6c includes a layer of AlGaAs with a graded composition and a layer of AlGaAs with a uniform composition. The composition gradation means that the Al composition of the first emitter cap layer increase from 0 to 0.2 in the direction from the second emitter cap layer to the emitter layer (the x value changes from 0 to 0.2). Additionally, the uniform composition means that the Al composition is 0.2, and the doping concentration of the first emitter cap layer of the HBT is about $1 \times 10^{18}/cm^3$.

According to the above description, through adjusting the semiconductor material composition, the graded bandgap of the first emitter cap layer 62 may start from the bandgap of the second emitter cap layer 64 or the ohmic contact layer 70, but is not limited thereto. The first emitter cap layer 62 or the second emitter cap layer 64 includes a graded bandgap selected from the group consisting of linear graded bandgap, non-linear graded bandgap, and step-like graded bandgap. Wherein, the bandgap of the first emitter cap layer 62 or the second emitter cap layer 64 may include at least one or more constant bandgaps before, during or after the gradually-increasing bandgap.

Considering the trade-off of the difficulty in manufacturing, the ruggedness improvement, and the emitter resistance, the first emitter cap layer 62 has a thickness of 1 nm to 500 nm, preferably 10 nm to 300 nm, or optimally 20 nm to 200 nm; and considering the trade-off of the breakdown voltage and the emitter-base junction capacitance, the first emitter cap layer 62 has an N-type doping concentration of $1 \times 10^{15}/cm^3$ to $5 \times 10^{18}/cm^3$, preferably $1 \times 10^{17}/cm^3$ to $4 \times 10^{18}/cm^3$, or optimally, $3 \times 10^{17}/cm^3$ to $3 \times 10^{18}/cm^3$. Moreover, the second emitter cap layer 64 has a thickness of 1 nm to 500 nm, and an N-type doping concentration of the second emitter cap layer is between $1 \times 10^{15}/cm^3$ and $5 \times 10^{18}/cm^3$.

According to an embodiment of the present disclosure, the first emitter cap layer 62 or the second emitter cap layer 64 can reduce the conduction band electron barrier from the ohmic contact layer 70 to the emitter layer 50 by adjusting the composition in the semiconductor material (such as adjusting the Al composition), especially the formation of the Type II band alignment can reduce the emitter resistance (Re). Therefore, the first emitter cap layer 62 does not need to use a highly doped N-type material, so that the emitter-base junction breakdown voltage can be greatly increased without increasing the emitter resistance, and the junction capacitance of the emitter-base junction can be greatly reduced to improve the RF performance or ruggedness of the HBT. Furthermore, since the bandgap of the emitter cap layer formed of Al-containing semiconductor material generally has a wider bandgap than the conventional GaAs emitter cap layer, the emitter cap layer with wider bandgap can also have higher breakdown voltage of the emitter-base junction and improve the HBT ruggedness. Compared with GaAs as an emitter cap layer, since the first emitter cap layer 62 or second emitter cap layer 64 mainly containing AlGaAs material, the AlGaAs has a property of higher thermal coefficient of resistance than that of GaAs. When the HBT is operated at a very high power density, the junction temperature will be increased. The resistance of the first emitter cap layer 62 containing AlGaAs material or the like will rapidly increase and improve the HBT ruggedness. While the HBT under a normal operating power density, the first emitter cap layer 62 or second emitter cap layer 64 containing a material such as AlGaAs does not significantly increase the emitter resistance for the above reasons. Therefore, the RF performance of HBT would not have a significant negative impact.

In addition, the material InGaP, InGaAsP or InAlGaP of the emitter layer 50 may have atomic ordering effect, which may cause spontaneous polarization, and the higher ordering effect, the larger spontaneous polarization, resulting in a smaller bandgap of the material and a stronger electric field inside the materials. The stronger electric field will deplete more carriers near or above the junction of the first emitter cap layer 62 and the emitter layer 50, causing an increase in the emitter resistance and affects the RF performance of the PA. Therefore, by using a lower ordering effect InGaP, InGaAsP and InAlGaP emitter layers 50, the carrier depletion near or above the junction of the first emitter cap layer 62 and the emitter layer 50 can be reduced, and the negative impact of emitter resistance or the design complexity of the first emitter cap layer 62 or the second emitter cap layer 64 can be avoided. Accordingly, the overall performance or ruggedness of the HBT and the PA can be improved.

Therefore, in an embodiment of the present disclosure, in order to determine the atomic ordering effect in the emitter layer 50, the photoluminescence (PL) spectroscopy is used for evaluation, and the radiation wavelength of the "material under test" is measured at room temperature. In addition, the "material under test" is lattice-matched to the substrate. In this method, first, the material of the emitter layer 50 with a thickness of several hundred nanometers is epitaxially grown on a substrate by the same growth condition as the emitter layer 50. When the emitter layer material is with higher ordering effect, its bandgap is relatively lower, so the PL peak wavelength of the emitter material is relatively longer as compared with lower ordering effect emitter materials when PL measurement is performed.

Figure 7:
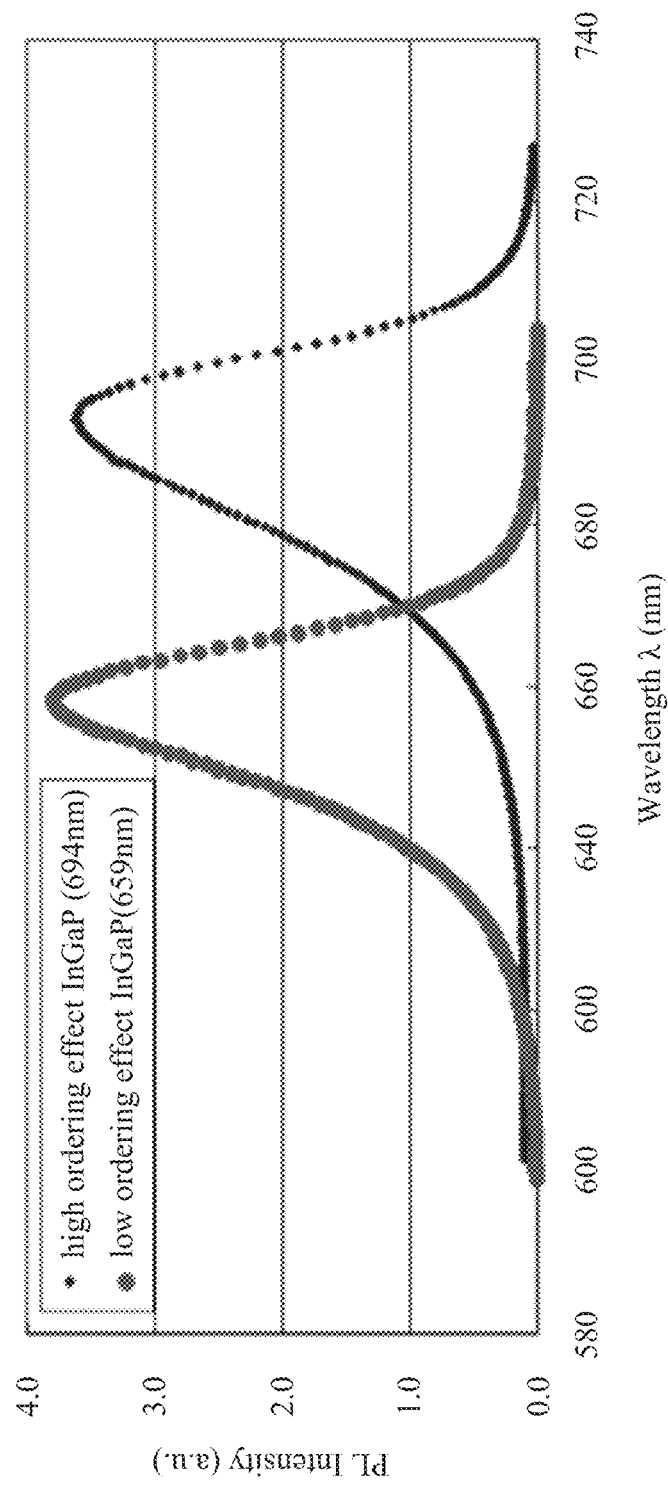
FIG. 7 shows a photoluminescence (PL) spectroscopy of indium gallium phosphide (InGaP) as a material of the emitter layer in accordance with the present disclosure.

FIG. 7 is a PL spectrum of InGaP measured by photoluminescence spectroscopy. Wherein, InGaP with higher ordering effect has a lower bandgap, so the radiated the PL peak wavelength is longer, which is 694 nm, while InGaP with lower ordering effect has a larger bandgap, so the radiated PL peak wavelength is shorter, which is 659 nm. In general, in the case of low ordering effect emitter materials, the InGaP PL peak wavelength could be as short as 640 nm, the radiated PL peak wavelength of InGaAsP could be as short as 645 nm, and the PL peak wavelength of InAlGaP could be as short as 635 nm. To avoid strong electric field generated by high ordering effect, the PL peak wavelength of the emitter layer 50 formed of InGaP may be 694 nm or less, preferably 685 nm or less, or preferably 675 nm or less. Similarly, the InGaAsP forming the emitter layer 50 may be PL peak wavelength of 710 nm or less, preferably 695 nm or less, or preferably 685 nm or less. The InAlGaP forming the emitter layer 50 may be PL peak wavelength of 685 nm or less, preferably 675 nm or less, or preferably 665 nm or less. For example, the photoluminescence peak wavelength of InGaP is between 650 nm and 660 nm or between 660 nm and 670 nm. It should be noted that if the "above materials" are not latticed-matched to the substrate, the materials will generate stress on the substrate and the bandgaps of the materials will change. As a result, the above radiation wavelength values will also change (deviate). Since the deviation is determined by the lattice mismatch between the materials and the substrate, if the lattice mismatch between the materials and the substrate can be known, the magnitude of the deviation can be known. In general, the lattice mismatch between the materials and the substrate can be known through X-RAY rocking curve measurement; take InGaP as an example, when mole fraction of group III In:Ga=0.51:0.49, the lattice thereof matches to the GaAs substrate; if the content of In is increased, InGaP is not latticed-matched to the GaAs substrate. When InGaP differs from the substrate by the X-RAY rocking curve being 40 arc-seconds, the radiation peak wavelength will increase by 1 nm, and when InGaP differs from the substrate by the X-RAY rocking curve being 80 arc-seconds, the radiation peak wavelength will increase by 2 nm, and so on and so forth. In the same situation as above, if the content of Ga is increased, InGaP is not latticed-matched to the GaAs substrate. When InGaP differs from the substrate by the X-RAY rocking curve being 40 arc-seconds, the radiation peak wavelength will decrease by 1 nm, and when InGaP differs from the substrate by the X-RAY rocking curve being 80 arc seconds, the radiation peak wavelength will decrease by 2 nm, and so on and so forth. It is worth mentioning that when InGaP is latticed-matched to the GaAs substrate, the radiation peak wavelength of the substrate is the same as that of InGaP, i.e., the radiation peak wavelengths of the substrate and InGsP are overlapped, or appear at the same wavelength when the X-RAY rocking curve becomes about zero.

Figure 8:
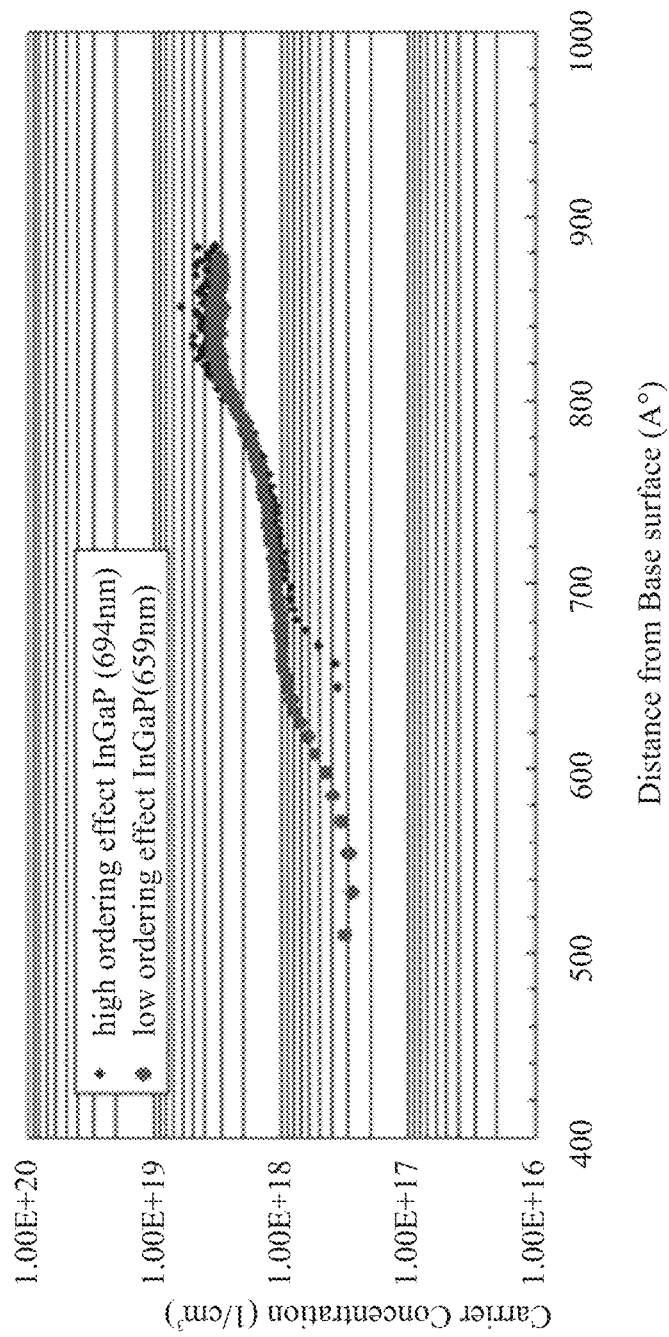
FIG. 8 shows the carrier concentration profile of the emitter-base junction obtained by the C-V measurement using indium gallium phosphide with differently ordering effect as an emitter layer.

FIG. 8 is an experiment result of carrier concentration profiles of emitter-base junction obtained by CV measurement using InGaP emitter with different ordering effects. Both of the InGaP emitters in FIG. 8 have the same doping concentration and both of the first emitter cap layers also have the same doping concentration. The base layer is P-type GaAs, the thickness is 80 nm, the carrier concentration is $4\times10^{19}/cm^3$, and the emitter layer is InGaP with different ordering effect, and the thickness is 40 nm.

The first emitter cap layer is formed of $Al_{0.15}Ga_{0.85}As$ with a thickness of 6 nm and an $Al_xGa_{1-x}As$ bandgap grade layer with a thickness of 30 nm (the value of x is gradually changed from 0.15 to 0) sequentially stacked on the InGaP emitter layer. As shown in FIG. 8, the InGaP emitter layer with a higher ordering effect forms a stronger electric field due to a larger spontaneous polarization, resulting in more carrier depletion near or above the junction of the first emitter cap layer and the emitter layer. The depletion of the carrier will cause an increase in the emitter resistance. To overcome the increase of the emitter resistance, it is necessary to increase the N-type doping concentration in the first emitter cap layer, which however will cause the emitter-base junction breakdown voltage drop and the emitter-base junction capacitance increase, resulting in negative impact on the ruggedness or RF performance of HBT. As shown in FIG. 8 the emitter-base junction carrier concentration profile of the InGaP emitter layer with lower ordering effect due to less spontaneous polarization effect, the first emitter cap carrier is less depleted and therefore the negative impact on Re is insignificant.

Figure 9:
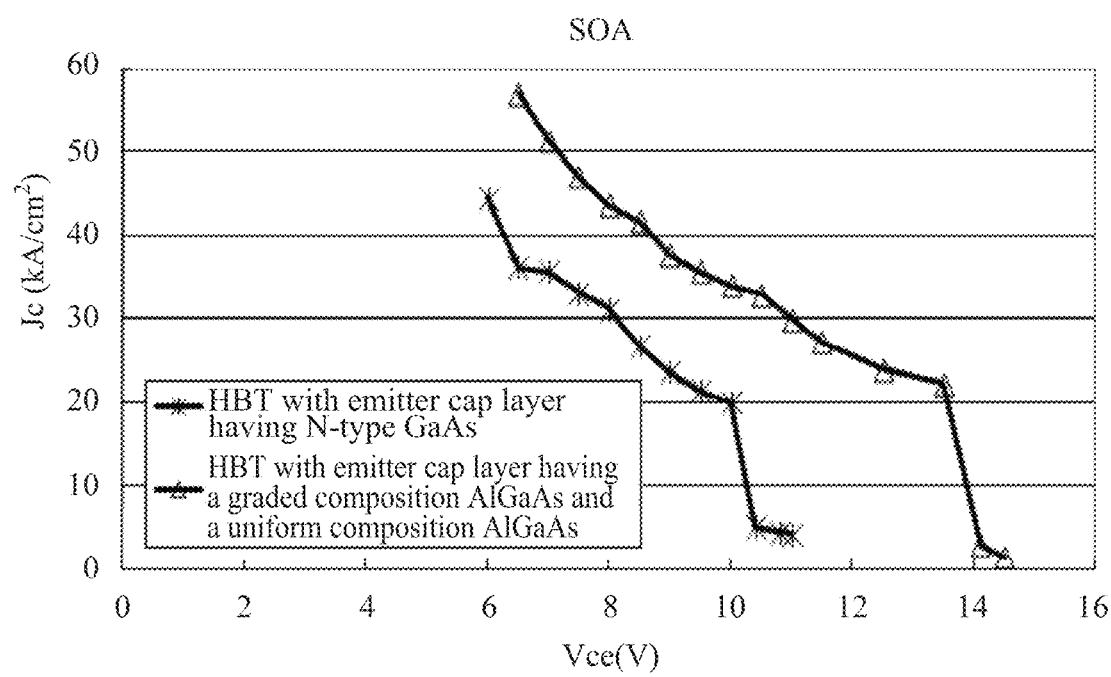
FIG. 9 is a comparison diagram showing a safe operation area (SOA) according to the HBT shown in FIG. 6c of the present disclosure and the HBT of prior art, wherein the vertical axis is the collector current density Jc ($kA/cm^2$), and the horizontal axis is the collector-emitter voltage Vce (V).

Referring to FIG. 9, FIG. 9 is a comparison diagram showing a safe operation area (SOA) according to the HBT shown in FIG. 6c of the present disclosure and the HBT of prior art. The prior art HBT includes an emitter cap layer. The total thickness of the first emitter cap layer and the second emitter cap layer of the HBT of FIG. 6c is approximately equal to the total thickness of the emitter cap layer of the prior art HBT. In FIG. 9, the material of the emitter cap layer of the prior art HBT is N-type GaAs, and the N-type doping concentration is about $4.0\times10^{18}/cm^3$. The first emitter cap layer of the HBT in FIG. 6c includes a layer of AlGaAs with a graded composition and a layer of AlGaAs with a uniform composition. The composition gradation means that the Al composition of the first emitter cap layer increase from 0 to 0.2 in the direction from the second emitter cap layer to the emitter layer (the x value changes from 0 to 0.2). Additionally, the uniform composition means that the Al composition is 0.2, and the doping concentration of the first emitter cap layer of the HBT is about $1\times10^{18}/cm^3$.

It can be clearly seen from FIG. 9 that the SOA of the HBT of FIG. 6c is larger than that of the HBT of the prior art, and the ruggedness of the HBT of the present disclosure is obviously improved.

Furthermore, in an embodiment of the present disclosure, the high ruggedness HBT structure 2 may further include an intermediate composite layer 15 formed between the substrate 10 and the sub-collector layer 20 and formed of a semiconductor material.

In an embodiment of the present disclosure, the intermediate composite layer 15 includes at least a buffer layer, and the buffer layer is formed of a III-V semiconductor material.

In an embodiment of the present disclosure, the intermediate composite layer 15 includes a field effect transistor.

In an embodiment of the present disclosure, the intermediate composite layer 15 includes a pseudomorphic high electron mobility transistor, which is sequentially stacked on the substrate, including: at least a buffer layer, a first donor layer, a first spacer layer, a channel layer, a second spacer layer, a second donor layer, a Schottky layer, an etch stop layer, and a cap layer for ohmic contact; the buffer layer includes a III-V semiconductor material; the first donor layer or the second donor layer includes at least an N-type semiconductor material selected from the group consisting of GaAs, AlGaAs, InAlGaP, InGaP, and InGaAsP; the first spacer layer or the second spacer layer includes at least a semiconductor material selected from the group consisting of GaAs, AlGaAs, InAlGaP, InGaP, and InGaAsP; the channel layer including a semiconductor material selected from the group consisting of GaAs, InGaAs, AlGaAs, InAlGaP, InGaP, and InGaAsP; the Schottky layer includes at least a semiconductor material selected from the group consisting of GaAs, AlGaAs, InAlGaP, InGaP, and InGaAsP; the etch stop layer includes at least a semiconductor material selected from the group consisting of GaAs, AlGaAs, InAlGaP, InGaAsP, InGaP, and AlAs; and the cap layer includes an N-type III-V semiconductor material.

Furthermore, in an embodiment of the present disclosure, the high ruggedness HBT structure 2 may further include a spacer layer 55 formed between the first emitter cap layer 62 and the emitter layer 50 or between the first emitter cap layer 62 and the second emitter cap layer 64. The spacer layer 55 includes an N-type or undoped III-V semiconductor material. The use of the spacer layer 55 can be exemplified by, but not limited to, adjusting the bandgap profile, reducing the manufacturing difficulty, improving the process yield, using as an etch stop layer or end point detection of the etching process, and the spacer layer 55 can also be as a quantum well. For example, the spacer layer 55 has a thickness of 0.2 nm to 200 nm and an N-type doping concentration of $1\times10^{15}/cm^3$ to $5\times10^{18}/cm^3$, preferably $1\times10^{17}/cm^3$ to $4\times10^{18}/cm^3$, and optimally $3\times10^{17}/cm^3$ to $3\times10^{18}/cm^3$.

The material of the spacer layer 55 is not limited as long as it is a known N-type or undoped III-V semiconductor material. For example, the spacer layer 55 may include an N-type or undoped semiconductor material selected from the group consisting of AlGaAs, AlGaAsN, AlGaAsP, AlGaAsSb, AlGaAsBi, InAlGaAs, InGaP, InGaAsP, InGaAs, GaAsSb, InAlGaP, and GaAs.

Further, the bandgap of the spacer layer 55 may be changed by the change of the composition in the semiconductor material, so that the spacer layer 55 may include at least one of gradually-increasing bandgap or gradually-decreasing bandgap in the direction from the second emitter cap layer 64 towards the emitter layer 50. However, the spacer layer 55 is not limited to a graded layer of compositional change, but may also be a uniform layer such that the spacer layer 55 behaves as a constant bandgap. The spacer layer 55 may also be a combination of a graded layer and a uniform layer, such that the bandgap change of the spacer layer 55 in the direction from the second emitter cap layer 64 towards the emitter layer 50 may include at least one of gradually-increasing bandgap, constant bandgap and gradually-decreasing bandgap. Similarly, the graded bandgap may further include linear graded bandgap, nonlinear graded bandgap, step-like graded bandgap or a combination thereof.

For example, in the case where the energy level of conduction band of the first emitter cap layer 62 is lower than the energy level of conduction band of the emitter layer 50 (Type I), a spacer layer 55 containing at least a gradually-increasing bandgap may be used to reduce or eliminate the electron barrier between the first emitter cap layer 62 and the emitter layer 50. In addition, when the spacer layer 55 with the graded bandgap is introduced, resulting in the energy level of conduction band of the spacer layer 55 higher than the conduction band of the emitter layer 50 (Type II), since the electrons do not encounter the barrier between the spacer layer 55 and the emitter layer 50, there is no impact on the emitter resistance.

In the case where the energy level of conduction band of the first emitter cap layer 62 is higher than the energy level of conduction band of the emitter layer 50 (Type II), if a spacer layer 55 containing at least a gradually-decreasing bandgap is used as the etching stop layer or the like, the energy level of conduction band of the spacer layer 55 can be equal to the energy level of conduction band of the emitter layer 50. Furthermore, after the spacer layer 55 is added, the energy level of conduction band of the spacer layer 55 may be lower than that of the emitter layer 50 and the electron barrier may be formed between the spacer layer 55 and the emitter layer 50. However, since the spacer layer 55 can be served as a quantum well, the electron energy level of the spacer layer 55 is quantized, with the result that the energy level of the spacer layer 55 is increased. When the electrons pass between the spacer layer 55 and the emitter layer 50, because electron barrier is lower, the emitter resistance does not increase significantly. In addition, in consideration of the process, a spacer layer 55 having at least a gradually-increasing bandgap is introduced so that the energy level of conduction band of the spacer layer 55 could be higher than the energy level of the conduction band of the emitter layer 50. In this case, there is no impact on emitter resistance.

In addition, the above description is to make those skilled in the art understand that when the spacer layer 55 is used to improve the process, no matter what the bandgap is, (i.e., the bandgap includes gradually-increasing bandgap, constant bandgap, gradually-decreasing bandgap or a combination thereof) the spacer layer 55 does not substantially cause a significant increase in the emitter resistance, and is not intended to limit the bandgap engineering of the spacer layer 55 to the above example.

Through the description of the above embodiments, the present disclosure provides a high ruggedness HBT, by the Al-containing first emitter cap layer or second emitter cap layer, in addition to effectively increasing the breakdown voltage of the emitter-base junction or reducing the emitter-base junction capacitance without increasing or slightly increasing the emitter resistance. Also, the present disclosure utilizes the characteristics of the AlGaAs-containing material having a wider bandgap and higher thermal coefficient of resistance, thereby significantly improving the ruggedness or RF performance of the power amplifier at high power density operation. The present disclosure can improve the overall efficiency of the PA by changing the HBT design, such as reducing Re, to trade-off some of the increased PA ruggedness in exchange for further improving the efficiency and linearity of the PA and the flexibility of the design.

In addition, to avoid a high emitter resistance due to strong spontaneous polarization of the emitter layer material, the PL method is used to evaluate the ordering effect of the emitter layer material, thereby enabling the determination and appropriate application of a lower ordering effect emitter layer formed of InGaP, InGaAsP, InAlGaP, thus reducing the carrier depletion near or above the junction of the first emitter cap layer and the emitter layer, avoiding the negative impact on the PA performance, or avoiding the design complexity of the first emitter cap layer or the second emitter cap layer, and further enhancing the overall electrical characteristics or ruggedness of the HBT and PA.

Figure 10:
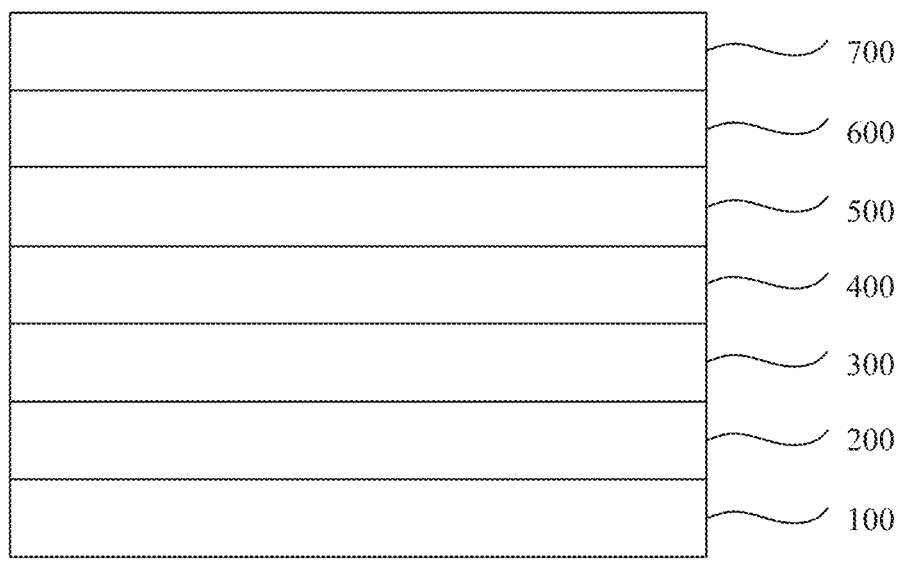
FIG. 10 shows a schematic view of the high ruggedness HBT in accordance with a second embodiment of the present disclosure, wherein a portion of the emitter cap layer is a current clamping layer.
Figure 11A:
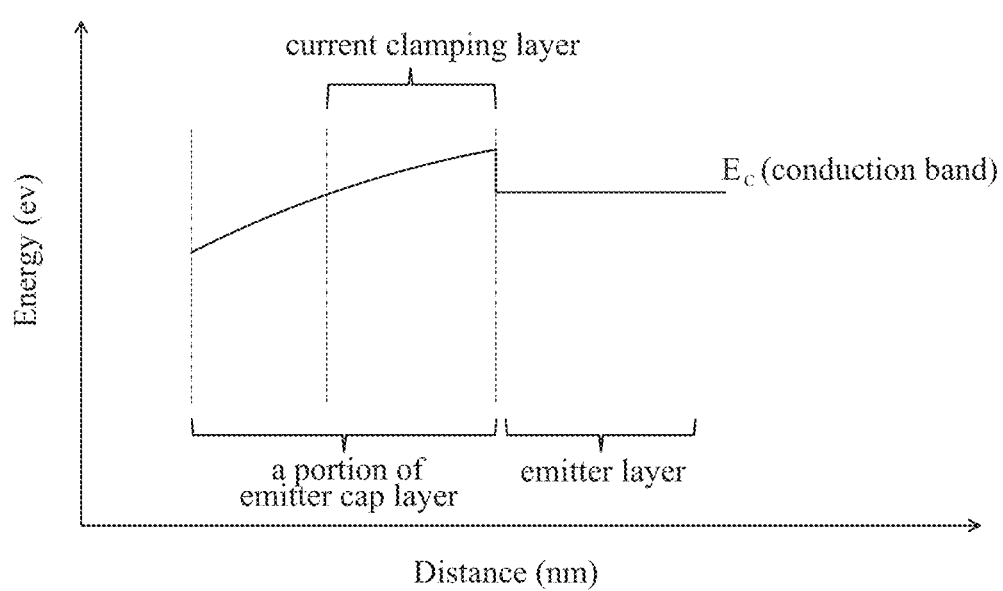
FIG. 11a is a schematic view of the conduction band energy band diagram between a current clamping layer and an emitter layer in a HBT of the present disclosure.
Figure 11B:
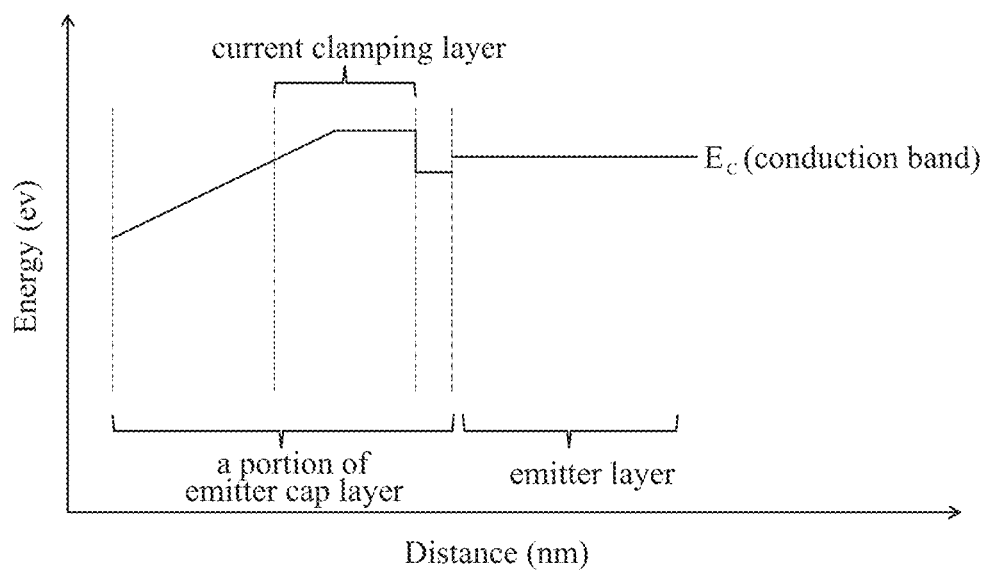
FIG. 11b is a schematic view of the conduction band energy band diagram between a current clamping layer and an emitter layer in a HBT of the present disclosure.
Figure 11C:
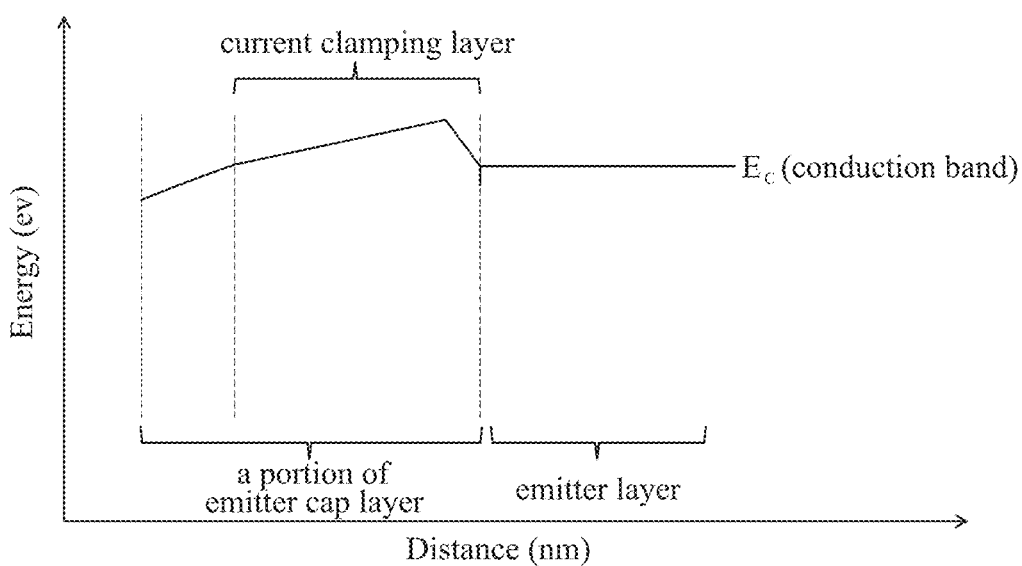
FIG. 11c is a schematic view of the conduction band energy band diagram between a current clamping layer and an emitter layer in a HBT of the present disclosure.
Figure 11D:
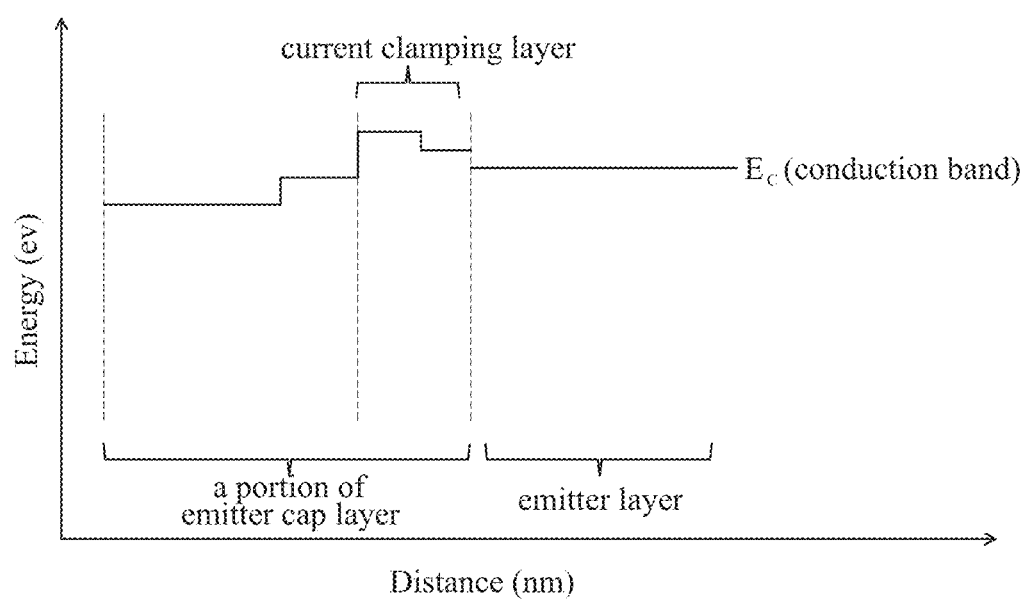
FIG. 11d is a schematic view of the conduction band energy band diagram between a current clamping layer and an emitter layer in a HBT of the present disclosure.

FIG. 10 is a schematic diagram of a high ruggedness HBT structure according to a second embodiment of the present disclosure. As shown in FIG. 10, in the second embodiment, the HBT structure 3 is formed on a substrate 100 with a sub-collector layer 200, a collector layer 300, a base layer 400, an emitter layer 500, an emitter cap layer 600 and an ohmic contact layer 700. At least a portion of the emitter cap layer 600 is a current clamping layer, and an electron affinity of the current clamping layer is less than or approximately equal to an electron affinity of the emitter layer.

The emitter layer 500 include at least one N-type semiconductor material selected from the group consisting of InGaP, InGaAsP, AlGaAs, and InAlGaP.

The current clamping layer or the emitter cap layer may include a material selected from the group consisting of InGaAs, AlGaAs, AlGaAsN, AlGaAsP, AlGaAsSb, AlGaAsBi, InAlGaAs, InGaP, InGaAsP, GaAsSb, InAlGaP and GaAs. The current clamping layer or the emitter cap layer has a thickness of 1 nm to 500 nm, an N-type doping concentration of the current clamping layer or the emitter cap layer is between $1\times10^{15}/cm^3$ and $5\times10^{18}/cm^3$.

Since the electron affinity of the current clamping layer is less than or approximately equal to the electron affinity of the emitter layer, an electron barrier of the current clamping layer will become higher when the transistor is operated at a higher current density. When the current of the transistor reaches a certain level, it will be limited to prevent the HBT from operating at too high current density, thereby reducing the risk of transistor damage and improving the ruggedness of the HBT. The electron barrier of the current clamping layer will increase with the increase of current density. Moreover, the magnitude of the increase in the electron barrier may vary depending on the material, composition, doping concentration, or doping method of the emitter cap layer, the current clamping layer, or the emitter layer.

FIGS. 11a-11d are schematic diagrams showing the relationship between the conduction band of the current clamping layer and the conduction band of the emitter layer. In FIGS. 11a-11d, a current clamping layer is formed in a portion of the emitter cap layer, and the current clamping layer is provided at a different position in the emitter cap layer. As shown in these schematic diagrams, the position of the current clamping layer is not limited, as long as the electron affinity of the current clamping layer is less than or approximately equal to the electron affinity of the emitter layer. In short, as long as the electron affinity of a portion of the emitter cap layer is less than or approximately equal to the emitter layer, even if the electron affinity of the other portions of the emitter cap layer is greater than the electron affinity of the emitter layer or whether the current clamping layer is connected to the emitter layer, the current clamping layer can still provide the function of current clamping. Therefore, in the present disclosure, only some diagrams are listed as representatives or examples. As long as a current clamping layer is provided in a portion of an emitter cap layer, examples, embodiments and methods are considered within the scope of the present disclosure.

It is worth noting that the emitter cap layer of the HBT in FIG. 10 is provided with a current clamping layer, and the electron affinity of the current clamping layer is less than or approximately equal to that of the emitter layer. Referring to FIG. 6c, the electron affinity of a portion of the first emitter cap layer in the HBT is less than the electron affinity of the emitter layer. Therefore, a portion of the first emitter cap layer also serve as the current clamping layer. As such, according to the embodiments herein, any HBT having a current clamping layer will also substantially improve SOA or ruggedness Both the first emitter cap layer or the second emitter cap layer of the first embodiment and the current clamping layer of the second embodiment can enhance the ruggedness of the HBT. Both of them can make different changes in specific technical means in accordance with different needs.

The substrate, the sub-collector layer, the collector layer, the base layer and the ohmic contact layer in the second embodiment are the same as the substrate, the sub-collector layer, the collector layer, the base layer and the ohmic contact layer in the first embodiment. Accordingly, the above layers in the second embodiment are not repeated. Please refer to the above for details.

An intermediate composite layer or a spacer layer can be selected and used for a HBT having a current clamping layer according to implementation requirements. The embodiments of the intermediate composite layer and the spacer layer have been described in the foregoing, so they will not be repeated herein. Please refer to the above for details. It should be noted that the spacer layer in the second embodiment is disposed on the emitter layer or between the emitter layer and the emitter cap layer or between the emitter cap layer and the ohmic contact layer.

According to implementation requirements, each embodiment of the HBT having a current clamping layer can be used in conjunction with an embodiment or some embodiments of the emitter layer in the first embodiment; or each embodiment of the HBT having a current clamping layer can be used in conjunction with an embodiment or some embodiments of the graded bandgap (the first emitter cap layer or the second emitter cap layer) in the first embodiment. As described above, the graded bandgap includes a linear graded bandgap, a non-liner graded bandgap, a step-like graded bandgap, or a combination thereof. The embodiments of the emitter layer and the graded bandgap (the first emitter cap layer or the second emitter cap layer) have been described in the foregoing, and therefore will not be repeated herein.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A high ruggedness heterojunction bipolar transistor, comprising:
   a substrate;
   a sub-collector layer being on the substrate and comprising an N-type III-V semiconductor material;
   a collector layer being on the sub-collector layer and comprising a III-V semiconductor material;
   a base layer being on the collector layer and comprising a P-type III-V semiconductor material;
   an emitter layer being on the base layer and comprising an N-type semiconductor material selected from the group consisting of InGaP, InGaAsP and InAlGaP;
   a first emitter cap layer being on the emitter layer and comprising a III-V semiconductor material;
   a second emitter cap layer being on the first emitter cap layer and comprising a III-V semiconductor material; and
   an ohmic contact layer being on the second emitter cap layer and comprising an N-type III-V semiconductor material,
   wherein in a direction of the second emitter cap layer towards the emitter layer, a bandgap of the first emitter cap layer or the second emitter cap layer includes at least one of a gradually-increasing bandgap and a constant bandgap, and
   wherein by photoluminescence spectroscopy, in the N-type semiconductor material of the emitter layer, the photoluminescence peak wavelength of InGaP is 694 nm or less, the photoluminescence peak wavelength of InGaAsP is 710 nm or less, and the photoluminescence peak wavelength of InAlGaP is 685 nm or less.

2. The high ruggedness heterojunction bipolar transistor as claimed in claim 1, wherein the first emitter cap layer comprises a semiconductor material selected from the group consisting of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, $Al_xGa_{1-x}As_{1-n}Bi_n$, $In_rAl_xGa_{1-x-r}As$ and $In_rAl_xGa_{1-x-r}P$, wherein $0<x<1$, and y, z, r, w, n≤0.1.

3. The high ruggedness heterojunction bipolar transistor as claimed in claim 1, wherein the first emitter cap layer comprises a semiconductor material selected from the group consisting of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, $Al_xGa_{1-x}As_{1-n}Bi_n$, $In_rAl_xGa_{1-x-r}As$ and $In_rAl_xGa_{1-x-r}P$, wherein a largest value of x is $0.03 \leq x \leq 0.8$, and y, z, r, w, n≤0.1.

4. The high ruggedness heterojunction bipolar transistor as claimed in claim 1, wherein the first emitter cap layer comprises a semiconductor material selected from the group consisting of $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, $Al_xGa_{1-x}As_{1-n}Bi_n$, $In_rAl_xGa_{1-x-r}As$ and $In_rAl_xGa_{1-x-r}P$, wherein a largest value of x is $0.05 \leq x \leq 0.4$, and y, z, r, w, n≤0.1.

5. The high ruggedness heterojunction bipolar transistor as claimed in claim 1, wherein the second emitter cap layer comprises an N-type semiconductor material selected from the group consisting of GaAs, AlGaAs, InGaP, InGaAsP, AlGaAsN, AlGaAsP, AlGaAsSb, AlGaAsBi, InAlGaAs, InAlGaP, InGaAs and GaAsSb.

6. The high ruggedness heterojunction bipolar transistor as claimed in claim 1, wherein the first emitter cap layer or the second emitter cap layer comprises at least a uniform layer, a graded layer or a combination of the uniform layer and the graded layer, and in the direction of the second emitter cap layer towards the emitter layer, a bandgap of the graded layer includes at least a gradually-increasing bandgap.

7. The high ruggedness heterojunction bipolar transistor as claimed in claim 1, wherein the first emitter cap layer or the second emitter cap layer has a thickness of 1 nm to 500 nm, and an N-type doping concentration of the first emitter cap layer or the second emitter cap layer is between $1 \times 10^{15}/cm^3$ and $5 \times 10^{18}/cm^3$.

8. The high ruggedness heterojunction bipolar transistor as claimed in claim 1, wherein by photoluminescence spectroscopy, in the N-type semiconductor material of the emitter layer, the photoluminescence peak wavelength of InGaP is 685 nm or less, the photoluminescence peak wavelength of InGaAsP is 695 nm or less, and the photoluminescence peak wavelength of InAlGaP is 675 nm or less.

9. The high ruggedness heterojunction bipolar transistor as claimed in claim 1, wherein by photoluminescence spectroscopy, in the N-type semiconductor material of the emitter layer, the photoluminescence peak wavelength of InGaP is 675 nm or less, the photoluminescence peak wavelength of InGaAsP is 685 nm or less, and the photoluminescence peak wavelength of InAlGaP is 665 nm or less.

10. The high ruggedness heterojunction bipolar transistor as claimed in claim 1, further comprising an intermediate composite layer being between the substrate and the sub-collector layer.

11. The high ruggedness heterojunction bipolar transistor as claimed in claim 10, wherein the intermediate composite layer comprises a buffer layer or a field effect transistor, and wherein the buffer layer comprises a III-V semiconductor material.

12. The high ruggedness heterojunction bipolar transistor as claimed in claim 10, wherein the intermediate composite layer comprises a pseudomorphic high electron mobility transistor, and the pseudomorphic high electron mobility transistor comprises:
  a buffer layer comprising a III-V semiconductor material;
  a first donor layer or a second donor layer comprising an N-type semiconductor material selected from the group consisting of GaAs, AlGaAs, InAlGaP, InGaP, and InGaAsP;
  a first spacer layer or a second spacer layer comprising a semiconductor material selected from the group consisting of GaAs, AlGaAs, InAlGaP, InGaP, and InGaAsP;
  a channel layer comprising a semiconductor material selected from the group consisting of GaAs, InGaAs, AlGaAs, InAlGaP, InGaP, and InGaAsP;
  a Schottky layer comprising a semiconductor material selected from the group consisting of GaAs, AlGaAs, InAlGaP, InGaP, and InGaAsP;
  an etch stop layer comprising a semiconductor material selected from the group consisting of GaAs, AlGaAs, InAlGaP, InGaAsP, InGaP, and AlAs; and
  a cap layer comprising an N-type III-V semiconductor material.

13. The high ruggedness heterojunction bipolar transistor as claimed in claim 1, further comprising a spacer layer between the first emitter cap layer and the emitter layer or between the first emitter cap layer and the second emitter cap layer, wherein the spacer layer comprises an N-type or undoped III-V semiconductor material.

14. The high ruggedness heterojunction bipolar transistor as claimed in claim 13, wherein the spacer layer has a thickness of 0.2 nm to 200 nm, and an N-type doping concentration of the spacer layer is between $1\times10^{15}/cm^3$ and $5\times10^{18}/cm^3$.

15. The high ruggedness heterojunction bipolar transistor as claimed in claim 13, wherein the spacer layer comprises a material selected from the group consisting of AlGaAs, AlGaAsN, AlGaAsP, AlGaAsSb, AlGaAsBi, InAlGaAs, InGaP, InGaAsP, InAlGaP, InGaAs, GaAsSb and GaAs.

16. The high ruggedness heterojunction bipolar transistor as claimed in claim 13, wherein the spacer layer comprises a bandgap selected from the group consisting of a gradually-increasing bandgap, a constant bandgap and a gradually-decreasing bandgap.

17. A high ruggedness heterojunction bipolar transistor, comprising:
  a substrate;
  a sub-collector layer being on the substrate and comprising an N-type III-V semiconductor material; a collector layer being on the sub-collector layer and comprising a III-V semiconductor material; a base layer being on the collector layer and comprising a P-type III-V semiconductor material; an emitter layer being on the base layer and comprising an N-type semiconductor material; an emitter cap layer being on the emitter layer and comprising a III-V semiconductor material; and
  an ohmic contact layer being on the emitter cap layer and comprising an N-type III-V semiconductor material,
  wherein at least a portion of the emitter cap layer is a current clamping layer, and an electron affinity of the current clamping layer is less than or approximately equal to an electron affinity of the emitter layer, and
  wherein by photoluminescence spectroscopy, in the N-type semiconductor material of the emitter layer, the photoluminescence peak wavelength of InGaP is 694 nm or less, the photoluminescence peak wavelength of InGaAsP is 710 nm or less, and the photoluminescence peak wavelength of InAlGaP is 685 nm or less.

18. The high ruggedness heterojunction bipolar transistor as claimed in claim 17, wherein the emitter layer comprises the N-type semiconductor material selected from the group consisting of InGaP, InGaAsP, AlGaAs, and InAlGaP; the current clamping layer or the emitter cap layer comprises a material selected from the group consisting of AlGaAs, AlGaAsN, AlGaAsP, AlGaAsSb, AlGaAsBi, InAlGaAs, InGaP, InGaAsP, GaAsSb, InAlGaP, GaAs and InGaAs; the current clamping layer or the emitter cap layer has a thickness of 1 nm to 500 nm; and an N-type doping concentration of the current clamping layer or the emitter cap layer is between $1\times10^{15}/cm^3$ and $5\times10^{18}/cm^3$.

19. The high ruggedness heterojunction bipolar transistor as claimed in claim 17, wherein by photoluminescence spectroscopy, in the N-type semiconductor material of the emitter layer, the photoluminescence peak wavelength of InGaP is 685 nm or less, the photoluminescence peak wavelength of InGaAsP is 695 nm or less, and the photoluminescence peak wavelength of InAlGaP is 675 nm or less.

20. The high ruggedness heterojunction bipolar transistor as claimed in claim 17, wherein by photoluminescence spectroscopy, in the N-type semiconductor material of the emitter layer, the photoluminescence peak wavelength of InGaP is 675 nm or less, the photoluminescence peak wavelength of InGaAsP is 685 nm or less, and the photoluminescence peak wavelength of InAlGaP is 665 nm or less.

* * * * *